US010433463B2

(12) United States Patent
Prest et al.

(10) Patent No.: US 10,433,463 B2
(45) Date of Patent: Oct. 1, 2019

(54) BULK AMORPHOUS ALLOY HEAT SINK

(75) Inventors: Christopher D. Prest, San Francisco, CA (US); Joseph Poole, San Francisco, CA (US); Joseph W. Stevick, North Tustin, CA (US); Quoc Tran Pham, Anaheim, CA (US); Theodore Andrew Waniuk, Lake Forest, CA (US)

(73) Assignees: Crucible Intellectual Property, LLC, Rancho Santa Margarita, CA (US); Apple Inc., Cupertino, CA (US)

( * ) Notice: Subject to any disclaimer, the term of this patent is extended or adjusted under 35 U.S.C. 154(b) by 1091 days.

(21) Appl. No.: 14/352,381

(22) PCT Filed: Oct. 20, 2011

(86) PCT No.: PCT/US2011/057109
§ 371 (c)(1),
(2), (4) Date: Jun. 20, 2014

(87) PCT Pub. No.: WO2013/058754
PCT Pub. Date: Apr. 25, 2013

(65) Prior Publication Data
US 2014/0334106 A1 Nov. 13, 2014

(51) Int. Cl.
| | |
|---|---|
| *H05K 7/20* | (2006.01) |
| *C22C 45/00* | (2006.01) |
| *C22C 45/10* | (2006.01) |
| *H01L 23/367* | (2006.01) |
| *H01L 23/373* | (2006.01) |
| *H01L 21/48* | (2006.01) |
| *B21D 22/02* | (2006.01) |
| *B21D 22/04* | (2006.01) |
| *B23P 19/00* | (2006.01) |
| *C21D 9/00* | (2006.01) |
| *C23C 16/27* | (2006.01) |
| *C23C 16/44* | (2006.01) |
| *C23C 16/513* | (2006.01) |
| *F25B 21/02* | (2006.01) |
| *F28F 21/08* | (2006.01) |
| *H01L 23/427* | (2006.01) |
| *H01L 23/467* | (2006.01) |
| *H01L 23/473* | (2006.01) |

(52) U.S. Cl.
CPC ........... *H05K 7/2039* (2013.01); *B21D 22/02* (2013.01); *B21D 22/04* (2013.01); *B23P 19/00* (2013.01); *C21D 9/0006* (2013.01); *C22C 45/00* (2013.01); *C22C 45/003* (2013.01); *C22C 45/10* (2013.01); *C23C 16/27* (2013.01); *C23C 16/44* (2013.01); *C23C 16/513* (2013.01); *F25B 21/02* (2013.01); *F28F 21/085* (2013.01); *F28F 21/086* (2013.01); *F28F 21/087* (2013.01); *H01L 21/4871* (2013.01); *H01L 23/3672* (2013.01); *H01L 23/3736* (2013.01); *H01L 23/427* (2013.01); *H01L 23/467* (2013.01); *H01L 23/473* (2013.01); *H01L 2924/0002* (2013.01); *H05K 7/20* (2013.01); *Y10T 29/49826* (2015.01)

(58) Field of Classification Search
CPC .................................................... C21D 9/0006
See application file for complete search history.

(56) References Cited

U.S. PATENT DOCUMENTS

| | | | |
|---|---|---|---|
| 5,247,203 A * | 9/1993 | Shigihara | ............ H01L 21/4882 257/713 |
| 5,288,344 A | 2/1994 | Peker et al. | |
| 5,368,659 A | 11/1994 | Peker et al. | |
| 5,618,359 A | 4/1997 | Lin et al. | |
| 5,735,975 A | 4/1998 | Lin et al. | |
| 5,950,704 A | 9/1999 | Johnson et al. | |
| 6,325,868 B1 | 12/2001 | Kim et al. | |
| 7,017,645 B2 | 3/2006 | Johnson et al. | |
| 7,575,040 B2 | 8/2009 | Johnson et al. | |
| 8,480,864 B2 | 7/2013 | Farmer et al. | |
| 8,641,839 B2 | 2/2014 | Schroers | |
| 8,929,071 B2 | 1/2015 | Beaupre et al. | |
| 2003/0024616 A1 | 2/2003 | Kim | |
| 2004/0200599 A1* | 10/2004 | Bradley | .................. C23C 16/26 165/80.3 |
| 2005/0253251 A1* | 11/2005 | An | ...................... H01L 21/4882 257/706 |
| 2007/0034305 A1 | 2/2007 | Suh | |
| 2008/0308258 A1 | 12/2008 | Pan et al. | |
| 2011/0162795 A1 | 7/2011 | Pham | |

FOREIGN PATENT DOCUMENTS

| | | |
|---|---|---|
| CN | 1694245 | 11/2005 |
| JP | 2001303218 | 10/2001 |
| JP | 2005-252110 | 9/2005 |
| JP | 2005252110 A * | 9/2005 |
| JP | 2005317962 | 11/2005 |
| WO | 01/94054 | 12/2001 |
| WO | 03/061356 | 7/2003 |
| WO | 2008/100583 | 8/2008 |
| WO | 2010/027317 | 3/2010 |

OTHER PUBLICATIONS

International Search Report/Written Opinion, PCT/ISA/210, PCT/ISA/220, PCT/ISA/237, dated Jul. 20, 2012.
AAVID Thermalloy, "Heat Sink Selection Guide," http://www.aavidthermalloy.com/solutions/overview, 2 pages.
(Continued)

*Primary Examiner* — Christopher S Kessler
(74) *Attorney, Agent, or Firm* — Brownstein Hyatt Farber Schreck, LLP

(57) ABSTRACT

Embodiments herein relate to a heat sink having nano- and/or micro-replication directly embossed in a bulk solidifying amorphous alloy comprising a metal alloy, wherein the heat sink is configured to transfer heat out of the heat sink by natural convection by air or forced convection by air, or by fluid phase change of a fluid and/or liquid cooling by a liquid. Other embodiments relate apparatus having the heat sink. Yet other embodiments relate to methods of manufacturing the heat sink and apparatus having the heat sink.

28 Claims, 4 Drawing Sheets

(56) References Cited

OTHER PUBLICATIONS

Inoue et al., "Bulk amorphous alloys with high mechanical strength and good soft magnetic properties in Fe-TM-B (TM=IV-VIII group transition metal) system," *Appl. Phys. Lett*, 1997, vol. 71, No. 4, pp. 464-466.

Shen et al., "Bulk Glassy $Co_{43}FE_{20}TA_{5.5}B_{31.5}$ Alloy with High Glass-Forming Ability and Good Soft Magnetic Properties," *Materials Transactions*, 2001 The Japan Institute of Metals, vol. 42, No. 10 p. 2136-2139.

* cited by examiner

BULK AMORPHOUS ALLOY HEAT SINK

FIELD OF THE INVENTION

The present invention relates to bulk-solidifying amorphous metal alloy heat sink.

BACKGROUND

A heat sink is a term for a component or assembly that transfers heat generated within a solid material to a fluid medium, such as air or a liquid. Examples of heat sinks are the heat exchangers used in refrigeration and air conditioning systems and the radiator (also a heat exchanger) in a car. Heat sinks also help to cool electronic and optoelectronic devices, such as higher-power lasers and light emitting diodes (LEDs).

A heat sink is physically designed to increase the surface area in contact with the cooling fluid surrounding it, such as the air. Approach air velocity, choice of material, fin (or other protrusion) design and surface treatment are some of the design factors which influence the thermal resistance, i.e. thermal performance, of a heat sink. One engineering application of heat sinks is in the thermal management of electronics, often computer central processing unit (CPU) or graphics processors. For these, heat sink attachment methods and thermal interface materials also influence the eventual junction or die temperature of the processor(s). T The rate at which heat is transferred from a heat sink, q, is the product of the heat transfer coefficient (h), the heat transfer surface area (A) through which heat is transferred and the temperature gradient ($\Delta T$).

$$q = h \cdot A \cdot \Delta T$$

where
- q=heat flow in input or lost heat flow, J/s=W
- h=heat transfer coefficient, W/(m$^2$K)
- A=heat transfer surface area, m$^2$
- $\Delta T$=difference in temperature between the solid surface and surrounding fluid area, K The heat transfer coefficient has SI units in watts per meter squared-Kelvin: W/(m$^2$K).

As the heat transferred from a heat sink is proportional to the heat transfer surface area, the higher is the heat transfer surface area of a heat sink, the higher would be the heat transferred from the heat sink.

The most common heat sink material is aluminum. Chemically pure aluminum is not used in the manufacture of heat sinks, but rather aluminum alloys. Aluminum alloy 1050A has one of the higher thermal conductivity values at 229 W/m·K. However, it is not recommended for machining, since it is a relatively soft material. Aluminum alloys 6061 and 6063 are the more commonly used aluminum alloys, with thermal conductivity values of 166 and 201 W/m·K, respectively.

Copper is also used since it has around twice the conductivity of aluminum, but is three times as heavy as aluminum. Copper could be around four to six times more expensive than aluminum. Aluminum has the added advantage that it is able to be extruded, while copper can not. Copper heat sinks are machined and skived. Another method of manufacture is to solder the fins into the heat sink base.

However, none of the conventional heat sink materials have a superplastic forming characteristic that would allow them to be thermoformed by processes such as stamping to create extremely high heat transfer surface area at a micro- and nano-level.

SUMMARY

Embodiments herein relate to a heat sink having nano- and/or micro-replication directly embossed in a bulk solidifying amorphous alloy comprising a metal alloy, wherein the heat sink is configured to transfer heat out of the heat sink by natural convection by air or forced convection by air, or by fluid phase change of a fluid and/or liquid cooling by a liquid. Other embodiments relate apparatus having the heat sink. Yet other embodiments relate to methods of manufacturing the heat sink and apparatus having the heat sink.

DETAILED DESCRIPTION

All publications, patents, and patent applications cited in this Specification are hereby incorporated by reference in their entirety.

The articles "a" and "an" are used herein to refer to one or to more than one (i.e., to at least one) of the grammatical object of the article. By way of example, "a polymer resin" means one polymer resin or more than one polymer resin. Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Bulk-solidifying amorphous alloys, or bulk metallic glasses ("BMG"), are a recently developed class of metallic materials. These alloys may be solidified and cooled at relatively slow rates, and they retain the amorphous, non-crystalline (i.e., glassy) state at room temperature. Amorphous alloys have many superior properties than their crystalline counterparts. However, if the cooling rate is not sufficiently high, crystals may form inside the alloy during cooling, so that the benefits of the amorphous state can be lost. For example, one challenge with the fabrication of bulk amorphous alloy parts is partial crystallization of the parts due to either slow cooling or impurities in the raw alloy material. As a high degree of amorphicity (and, conversely, a low degree of crystallinity) is desirable in BMG parts, there is a need to develop methods for casting BMG parts having controlled amount of amorphicity.

Figure 1:
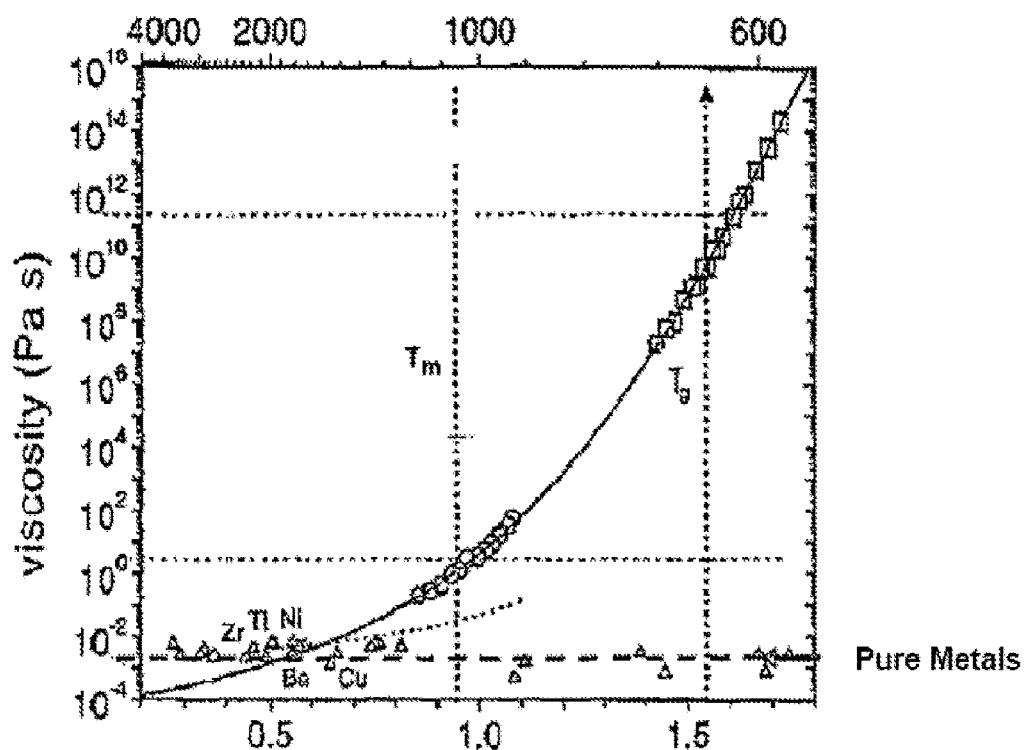
FIG. 1 provides a temperature-viscosity diagram of an exemplary bulk solidifying amorphous alloy.

FIG. 1 (obtained from U.S. Pat. No. 7,575,040) shows a viscosity-temperature graph of an exemplary bulk solidifying amorphous alloy, from the VIT-001 series of Zr—Ti—Ni—Cu—Be family manufactured by Liquidmetal Technology. It should be noted that there is no clear liquid/solid transformation for a bulk solidifying amorphous metal during the formation of an amorphous solid. The molten alloy becomes more and more viscous with increasing undercooling until it approaches solid form around the glass transition temperature. Accordingly, the temperature of solidification front for bulk solidifying amorphous alloys can be around glass transition temperature, where the alloy will practically act as a solid for the purposes of pulling out the quenched amorphous sheet product.

Figure 2:
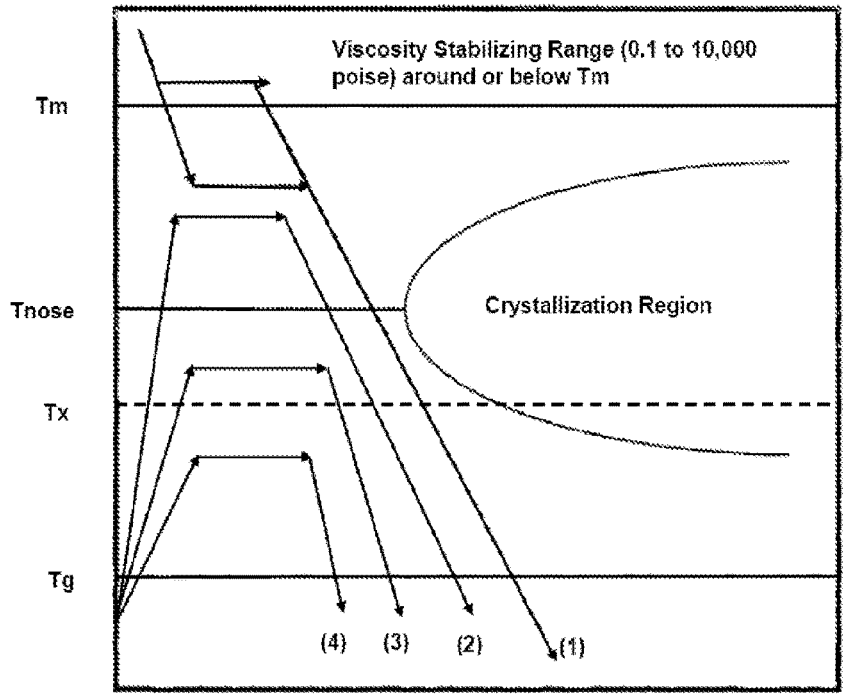
FIG. 2 provides a schematic of a time-temperature-transformation (TTT) diagram for an exemplary bulk solidifying amorphous alloy.

FIG. 2 (obtained from U.S. Pat. No. 7,575,040) shows the time-temperature-transformation (TTT) cooling curve of an exemplary bulk solidifying amorphous alloy, or TTT diagram. Bulk-solidifying amorphous metals do not experience a liquid/solid crystallization transformation upon cooling, as with conventional metals. Instead, the highly fluid, non crystalline form of the metal found at high temperatures (near a "melting temperature" Tm) becomes more viscous as the temperature is reduced (near to the glass transition temperature Tg), eventually taking on the outward physical properties of a conventional solid.

Even though there is no liquid/crystallization transformation for a bulk solidifying amorphous metal, a "melting temperature" Tm may be defined as the thermodynamic liquidus temperature of the corresponding crystalline phase. Under this regime, the viscosity of bulk-solidifying amorphous alloys at the melting temperature could lie in the range of about 0.1 poise to about 10,000 poise, and even sometimes under 0.01 poise. A lower viscosity at the "melting temperature" could provide faster and complete filling of intricate portions of the shell/mold with a bulk solidifying amorphous metal for forming the BMG parts. Furthermore, the cooling rate of the molten metal to form a BMG part has to such that the time-temperature profile during cooling does not traverse through the nose-shaped region bounding the crystallized region in the TTT diagram of FIG. 2. In FIG. 2, Tnose is the critical crystallization temperature Tx where crystallization is most rapid and occurs in the shortest time scale.

The supercooled liquid region, the temperature region between Tg and Tx is a manifestation of the extraordinary stability against crystallization of bulk solidification alloys. In this temperature region the bulk solidifying alloy can exist as a high viscous liquid. The viscosity of the bulk solidifying alloy in the supercooled liquid region can vary between $10^{12}$ Pa s at the glass transition temperature down to $10^5$ Pa s at the crystallization temperature, the high temperature limit of the supercooled liquid region. Liquids with such viscosities can undergo substantial plastic strain under an applied pressure. The embodiments herein make use of the large plastic formability in the supercooled liquid region as a forming and separating method.

One needs to clarify something about Tx. Technically, the nose-shaped curve shown in the TTT diagram describes Tx as a function of temperature and time. Thus, regardless of the trajectory that one takes while heating or cooling a metal alloy, when one hits the TTT curve, one has reached Tx. In FIG. 2, Tx is shown as a dashed line as Tx can vary from close to Tm to close to Tg.

The schematic TTT diagram of FIG. 2 shows processing methods of die casting from at or above Tm to below Tg without the time-temperature trajectory (shown as (1) as an example trajectory) hitting the TTT curve. During die casting, the forming takes place substantially simultaneously with fast cooling to avoid the trajectory hitting the TTT curve. The processing methods for superplastic forming (SPF) from at or below Tg to below Tm without the time-temperature trajectory (shown as (2), (3) and (4) as example trajectories) hitting the TTT curve. In SPF, the amorphous BMG is reheated into the supercooled liquid region where the available processing window could be much larger than die casting, resulting in better controllability of the process. The SPF process does not require fast cooling to avoid crystallization during cooling. Also, as shown by example trajectories (2), (3) and (4), the SPF can be carried out with the highest temperature during SPF being above Tnose or below Tnose, up to about Tm. If one heats up a piece of amorphous alloy but manages to avoid hitting the TTT curve, you have heated "between Tg and Tm", but one could have not reached Tx.

Typical differential scanning calorimeter (DSC) heating curves of bulk-solidifying amorphous alloys taken at a heating rate of 20 degree C./min describe, for the most part, a particular trajectory across the TTT data where one could likely see a Tg at a certain temperature, a Tx when the DSC heating ramp crosses the TTT crystallization onset, and eventually melting peaks when the same trajectory crosses the temperature range for melting. If one heats a bulk-solidifying amorphous alloy at a rapid heating rate as shown by the ramp up portion of trajectories (2), (3) and (4) in FIG. 2, then one could avoid the TTT curve entirely, and the DSC data could show a glass transition but no Tx upon heating. Another way to think about it is trajectories (2), (3) and (4) can fall anywhere in temperature between the nose of the TTT curve (and even above it) and the Tg line, as long as it does not hit the crystallization curve. That just means that the horizontal plateau in trajectories might get much shorter as one increases the processing temperature.

Phase

The term "phase" herein can refer to one that can be found in a thermodynamic phase diagram. A phase is a region of space (e.g., a thermodynamic system) throughout which all physical properties of a material are essentially uniform. Examples of physical properties include density, index of refraction, chemical composition and lattice periodicity. A simple description of a phase is a region of material that is chemically uniform, physically distinct, and/or mechanically separable. For example, in a system consisting of ice and water in a glass jar, the ice cubes are one phase, the water is a second phase, and the humid air over the water is a third phase. The glass of the jar is another separate phase. A phase can refer to a solid solution, which can be a binary, tertiary, quaternary, or more, solution, or a compound, such as an intermetallic compound. As another example, an amorphous phase is distinct from a crystalline phase.

Metal, Transition Metal, and Non-Metal

The term "metal" refers to an electropositive chemical element. The term "element" in this Specification refers generally to an element that can be found in a Periodic Table. Physically, a metal atom in the ground state contains a partially filled band with an empty state close to an occupied state. The term "transition metal" is any of the metallic elements within Groups 3 to 12 in the Periodic Table that have an incomplete inner electron shell and that serve as transitional links between the most and the least electropositive in a series of elements. Transition metals are characterized by multiple valences, colored compounds, and the ability to form stable complex ions. The term "nonmetal" refers to a chemical element that does not have the capacity to lose electrons and form a positive ion.

Depending on the application, any suitable nonmetal elements, or their combinations, can be used. The alloy (or "alloy composition") can comprise multiple nonmetal elements, such as at least two, at least three, at least four, or more, nonmetal elements. A nonmetal element can be any element that is found in Groups 13-17 in the Periodic Table. For example, a nonmetal element can be any one of F, Cl, Br, I, At, O, S, Se, Te, Po, N, P, As, Sb, Bi, C, Si, Ge, Sn, Pb, and B. Occasionally, a nonmetal element can also refer to certain metalloids (e.g., B, Si, Ge, As, Sb, Te, and Po) in Groups 13-17. In one embodiment, the nonmetal elements can include B, Si, C, P, or combinations thereof. Accordingly, for example, the alloy can comprise a boride, a carbide, or both.

A transition metal element can be any of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, meitnerium, ununnilium, unununium, and ununbium. In one embodiment, a BMG containing a transition metal element can have at least one of Sc, Y, La, Ac, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, and Hg. Depending on the application, any suitable transitional metal elements, or their combinations, can be used. The alloy composition can comprise multiple transitional metal elements, such as at least two, at least three, at least four, or more, transitional metal elements.

The presently described alloy or alloy "sample" or "specimen" alloy can have any shape or size. For example, the alloy can have a shape of a particulate, which can have a shape such as spherical, ellipsoid, wire-like, rod-like, sheet-like, flake-like, or an irregular shape. The particulate can have any size. For example, it can have an average diameter of between about 1 micron and about 100 microns, such as between about 5 microns and about 80 microns, such as between about 10 microns and about 60 microns, such as between about 15 microns and about 50 microns, such as between about 15 microns and about 45 microns, such as between about 20 microns and about 40 microns, such as between about 25 microns and about 35 microns. For example, in one embodiment, the average diameter of the particulate is between about 25 microns and about 44 microns. In some embodiments, smaller particulates, such as those in the nanometer range, or larger particulates, such as those bigger than 100 microns, can be used.

The alloy sample or specimen can also be of a much larger dimension. For example, it can be a bulk structural component, such as an ingot, housing/casing of an electronic device or even a portion of a structural component that has dimensions in the millimeter, centimeter, or meter range.

Solid Solution

The term "solid solution" refers to a solid form of a solution. The term "solution" refers to a mixture of two or more substances, which may be solids, liquids, gases, or a combination of these. The mixture can be homogeneous or heterogeneous. The term "mixture" is a composition of two or more substances that are combined with each other and are generally capable of being separated. Generally, the two or more substances are not chemically combined with each other.

Alloy

In some embodiments, the alloy composition described herein can be fully alloyed. In one embodiment, an "alloy" refers to a homogeneous mixture or solid solution of two or more metals, the atoms of one replacing or occupying interstitial positions between the atoms of the other; for example, brass is an alloy of zinc and copper. An alloy, in contrast to a composite, can refer to a partial or complete solid solution of one or more elements in a metal matrix, such as one or more compounds in a metallic matrix. The term alloy herein can refer to both a complete solid solution alloy that can give single solid phase microstructure and a partial solution that can give two or more phases. An alloy composition described herein can refer to one comprising an alloy or one comprising an alloy-containing composite.

Thus, a fully alloyed alloy can have a homogenous distribution of the constituents, be it a solid solution phase, a compound phase, or both. The term "fully alloyed" used herein can account for minor variations within the error tolerance. For example, it can refer to at least 90% alloyed, such as at least 95% alloyed, such as at least 99% alloyed, such as at least 99.5% alloyed, such as at least 99.9% alloyed. The percentage herein can refer to either volume percent or weight percentage, depending on the context. These percentages can be balanced by impurities, which can be in terms of composition or phases that are not a part of the alloy.

Amorphous or Non-Crystalline Solid

An "amorphous" or "non-crystalline solid" is a solid that lacks lattice periodicity, which is characteristic of a crystal. As used herein, an "amorphous solid" includes "glass" which is an amorphous solid that softens and transforms into a liquid-like state upon heating through the glass transition. Generally, amorphous materials lack the long-range order characteristic of a crystal, though they can possess some short-range order at the atomic length scale due to the nature of chemical bonding. The distinction between amorphous solids and crystalline solids can be made based on lattice periodicity as determined by structural characterization techniques such as x-ray diffraction and transmission electron microscopy.

The terms "order" and "disorder" designate the presence or absence of some symmetry or correlation in a many-particle system. The terms "long-range order" and "short-range order" distinguish order in materials based on length scales.

The strictest form of order in a solid is lattice periodicity: a certain pattern (the arrangement of atoms in a unit cell) is repeated again and again to form a translationally invariant tiling of space. This is the defining property of a crystal. Possible symmetries have been classified in 14 Bravais lattices and 230 space groups.

Lattice periodicity implies long-range order. If only one unit cell is known, then by virtue of the translational symmetry it is possible to accurately predict all atomic positions at arbitrary distances. The converse is generally true, except, for example, in quasi-crystals that have perfectly deterministic tilings but do not possess lattice periodicity.

Long-range order characterizes physical systems in which remote portions of the same sample exhibit correlated behavior. This can be expressed as a correlation function, namely the spin-spin correlation function: $G(x,x')=\langle s(x), s(x')\rangle$.

In the above function, s is the spin quantum number and x is the distance function within the particular system. This function is equal to unity when x=x' and decreases as the distance |x−x'| increases. Typically, it decays exponentially to zero at large distances, and the system is considered to be disordered. If, however, the correlation function decays to a constant value at large |x−x'|, then the system can be said to possess long-range order. If it decays to zero as a power of the distance, then it can be called quasi-long-range order. Note that what constitutes a large value of |x−x'| is relative.

A system can be said to present quenched disorder when some parameters defining its behavior are random variables that do not evolve with time (i.e., they are quenched or frozen)—e.g., spin glasses. It is opposite to annealed disorder, where the random variables are allowed to evolve themselves. Embodiments herein include systems comprising quenched disorder.

The alloy described herein can be crystalline, partially crystalline, amorphous, or substantially amorphous. For example, the alloy sample/specimen can include at least some crystallinity, with grains/crystals having sizes in the nanometer and/or micrometer ranges. Alternatively, the alloy can be substantially amorphous, such as fully amorphous. In one embodiment, the alloy composition is at least substantially not amorphous, such as being substantially crystalline, such as being entirely crystalline.

In one embodiment, the presence of a crystal or a plurality of crystals in an otherwise amorphous alloy can be construed as a "crystalline phase" therein. The degree of crystallinity (or "crystallinity" for short in some embodiments) of an alloy can refer to the amount of the crystalline phase present in the alloy. The degree can refer to, for example, a fraction of crystals present in the alloy. The fraction can refer to volume fraction or weight fraction, depending on the context. A measure of how "amorphous" an amorphous alloy is can be amorphicity. Amorphicity can be measured in terms of a degree of crystallinity. For example, in one embodiment, an alloy having a low degree of crystallinity can be said to have a high degree of amorphicity. In one embodiment, for example, an alloy having 60 vol % crystalline phase can have a 40 vol % amorphous phase.

Amorphous Alloy or Amorphous Metal

An "amorphous alloy" is an alloy having an amorphous content of more than 50% by volume, preferably more than 90% by volume of amorphous content, more preferably more than 95% by volume of amorphous content, and most preferably more than 99% to almost 100% by volume of amorphous content. Note that, as described above, an alloy high in amorphicity is equivalently low in degree of crystallinity. An "amorphous metal" is an amorphous metal material with a disordered atomic-scale structure. In contrast to most metals, which are crystalline and therefore have a highly ordered arrangement of atoms, amorphous alloys are non-crystalline. Materials in which such a disordered structure is produced directly from the liquid state during cooling are sometimes referred to as "glasses." Accordingly, amorphous metals are commonly referred to as "metallic glasses" or "glassy metals." In one embodiment, a bulk metallic glass ("BMG") can refer to an alloy, of which the microstructure is at least partially amorphous. However, there are several ways besides extremely rapid cooling to produce amorphous metals, including physical vapor deposition, solid-state reaction, ion irradiation, melt spinning, and mechanical alloying. Amorphous alloys can be a single class of materials, regardless of how they are prepared.

Amorphous metals can be produced through a variety of quick-cooling methods. For instance, amorphous metals can be produced by sputtering molten metal onto a spinning metal disk. The rapid cooling, on the order of millions of degrees a second, can be too fast for crystals to form, and the material is thus "locked in" a glassy state. Also, amorphous metals/alloys can be produced with critical cooling rates low enough to allow formation of amorphous structures in thick layers—e.g., bulk metallic glasses.

The terms "bulk metallic glass" ("BMG"), bulk amorphous alloy ("BAA"), and bulk solidifying amorphous alloy are used interchangeably herein. They refer to amorphous alloys having the smallest dimension at least in the millimeter range. For example, the dimension can be at least about 0.5 mm, such as at least about 1 mm, such as at least about 2 mm, such as at least about 4 mm, such as at least about 5 mm, such as at least about 6 mm, such as at least about 8 mm, such as at least about 10 mm, such as at least about 12 mm. Depending on the geometry, the dimension can refer to the diameter, radius, thickness, width, length, etc. A BMG can also be a metallic glass having at least one dimension in the centimeter range, such as at least about 1.0 cm, such as at least about 2.0 cm, such as at least about 5.0 cm, such as at least about 10.0 cm. In some embodiments, a BMG can have at least one dimension at least in the meter range. A BMG can take any of the shapes or forms described above, as related to a metallic glass. Accordingly, a BMG described herein in some embodiments can be different from a thin film made by a conventional deposition technique in one important aspect—the former can be of a much larger dimension than the latter.

Amorphous metals can be an alloy rather than a pure metal. The alloys may contain atoms of significantly different sizes, leading to low free volume (and therefore having viscosity up to orders of magnitude higher than other metals and alloys) in a molten state. The viscosity prevents the atoms from moving enough to form an ordered lattice. The material structure may result in low shrinkage during cooling and resistance to plastic deformation. The absence of grain boundaries, the weak spots of crystalline materials in some cases, may, for example, lead to better resistance to wear and corrosion. In one embodiment, amorphous metals, while technically glasses, may also be much tougher and less brittle than oxide glasses and ceramics.

Thermal conductivity of amorphous materials may be lower than that of their crystalline counterparts. To achieve formation of an amorphous structure even during slower cooling, the alloy may be made of three or more components, leading to complex crystal units with higher potential energy and lower probability of formation. The formation of amorphous alloy can depend on several factors: the composition of the components of the alloy; the atomic radius of the components (preferably with a significant difference of over 12% to achieve high packing density and low free volume); and the negative heat of mixing the combination of components, inhibiting crystal nucleation and prolonging the time the molten metal stays in a supercooled state. However, as the formation of an amorphous alloy is based on many different variables, it can be difficult to make a prior determination of whether an alloy composition could form an amorphous alloy.

Amorphous alloys, for example, of boron, silicon, phosphorus, and other glass formers with magnetic metals (iron, cobalt, nickel) may be magnetic, with low coercivity and high electrical resistance. The high resistance leads to low losses by eddy currents when subjected to alternating magnetic fields, a property useful, for example, as transformer magnetic cores.

Amorphous alloys may have a variety of potentially useful properties. In particular, they tend to be stronger than crystalline alloys of similar chemical composition, and they can sustain larger reversible ("elastic") deformations than crystalline alloys. Amorphous metals derive their strength directly from their non-crystalline structure, which can have none of the defects (such as dislocations) that limit the strength of crystalline alloys. For example, one modern amorphous metal, known as Vitreloy™, has a tensile strength that is almost twice that of high-grade titanium. In some embodiments, metallic glasses at room temperature are not ductile and tend to fail suddenly when loaded in tension, which limits the material applicability in reliability-critical applications, as the impending failure is not evident. Therefore, to overcome this challenge, metal matrix composite materials having a metallic glass matrix containing dendritic particles or fibers of a ductile crystalline metal can be used. Alternatively, a BMG low in element(s) that tend to cause embitterment (e.g., Ni) can be used. For example, a Ni-free BMG can be used to improve the ductility of the BMG.

Another useful property of bulk amorphous alloys is that they can be true glasses; in other words, they can soften and flow upon heating. This can allow for easy processing, such as by injection molding, in much the same way as polymers. As a result, amorphous alloys can be used for making sports equipment, medical devices, electronic components and equipment, and thin films. Thin films of amorphous metals can be deposited as protective coatings via a high velocity oxygen fuel technique.

A material can have an amorphous phase, a crystalline phase, or both. The amorphous and crystalline phases can have the same chemical composition and differ only in the microstructure—i.e., one amorphous and the other crystalline. Microstructure in one embodiment refers to the structure of a material as revealed by a microscope at 25× magnification or higher. Alternatively, the two phases can have different chemical compositions and microstructures. For example, a composition can be partially amorphous, substantially amorphous, or completely amorphous.

As described above, the degree of amorphicity (and conversely the degree of crystallinity) can be measured by fraction of crystals present in the alloy. The degree can refer to volume fraction of weight fraction of the crystalline phase present in the alloy. A partially amorphous composition can refer to a composition of at least about 5 vol % of which is of an amorphous phase, such as at least about 10 vol %, such as at least about 20 vol %, such as at least about 40 vol %, such as at least about 60 vol %, such as at least about 80 vol %, such as at least about 90 vol %. The terms "substantially" and "about" have been defined elsewhere in this application. Accordingly, a composition that is at least substantially amorphous can refer to one of which at least about 90 vol % is amorphous, such as at least about 95 vol %, such as at least about 98 vol %, such as at least about 99 vol %, such as at least about 99.5 vol %, such as at least about 99.8 vol %, such as at least about 99.9 vol %. In one embodiment, a substantially amorphous composition can have some incidental, insignificant amount of crystalline phase present therein.

In one embodiment, an amorphous alloy composition can be homogeneous with respect to the amorphous phase. A substance that is uniform in composition is homogeneous. This is in contrast to a substance that is heterogeneous. The term "composition" refers to the chemical composition and/or microstructure in the substance. A substance is homogeneous when a volume of the substance is divided in half and both halves have substantially the same composition. For example, a particulate suspension is homogeneous when a volume of the particulate suspension is divided in half and both halves have substantially the same volume of particles. However, it might be possible to see the individual particles under a microscope. Another example of a homogeneous substance is air where different ingredients therein are equally suspended, though the particles, gases and liquids in air can be analyzed separately or separated from air.

A composition that is homogeneous with respect to an amorphous alloy can refer to one having an amorphous phase substantially uniformly distributed throughout its microstructure. In other words, the composition macroscopically comprises a substantially uniformly distributed amorphous alloy throughout the composition. In an alternative embodiment, the composition can be of a composite, having an amorphous phase having therein a non-amorphous phase. The non-amorphous phase can be a crystal or a plurality of crystals. The crystals can be in the form of particulates of any shape, such as spherical, ellipsoid, wire-like, rod-like, sheet-like, flake-like, or an irregular shape. In one embodiment, it can have a dendritic form. For example, an at least partially amorphous composite composition can have a crystalline phase in the shape of dendrites dispersed in an amorphous phase matrix; the dispersion can be uniform or non-uniform, and the amorphous phase and the crystalline phase can have the same or a different chemical composition. In one embodiment, they have substantially the same chemical composition. In another embodiment, the crystalline phase can be more ductile than the BMG phase.

The methods described herein can be applicable to any type of amorphous alloy. Similarly, the amorphous alloy described herein as a constituent of a composition or article can be of any type. The amorphous alloy can comprise the element Zr, Hf, Ti, Cu, Ni, Pt, Pd, Fe, Mg, Au, La, Ag, Al, Mo, Nb, Be, or combinations thereof. Namely, the alloy can include any combination of these elements in its chemical formula or chemical composition. The elements can be present at different weight or volume percentages. For example, an iron "based" alloy can refer to an alloy having a non-insignificant weight percentage of iron present therein, the weight percent can be, for example, at least about 20 wt %, such as at least about 40 wt %, such as at least about 50 wt %, such as at least about 60 wt %, such as at least about 80 wt %. Alternatively, in one embodiment, the above-described percentages can be volume percentages, instead of weight percentages. Accordingly, an amorphous alloy can be zirconium-based, titanium-based, platinum-based, palladium-based, gold-based, silver-based, copper-based, iron-based, nickel-based, aluminum-based, molybdenum-based, and the like. The alloy can also be free of any of the aforementioned elements to suit a particular purpose. For example, in some embodiments, the alloy, or the composition including the alloy, can be substantially free of nickel, aluminum, titanium, beryllium, or combinations thereof. In one embodiment, the alloy or the composite is completely free of nickel, aluminum, titanium, beryllium, or combinations thereof.

For example, the amorphous alloy can have the formula $(Zr, Ti)_a(Ni, Cu, Fe)_b(Be, Al, Si, B)_c$, wherein a, b, and c each represents a weight or atomic percentage. In one embodiment, a is in the range of from 30 to 75, b is in the range of from 5 to 60, and c is in the range of from 0 to 50 in atomic percentages. Alternatively, the amorphous alloy can have the formula $(Zr, Ti)_a(Ni, Cu)_b(Be)_c$, wherein a, b, and c each represents a weight or atomic percentage. In one embodiment, a is in the range of from 40 to 75, b is in the range of from 5 to 50, and c is in the range of from 5 to 50 in atomic percentages. The alloy can also have the formula $(Zr, Ti)_a(Ni, Cu)_b(Be)_c$, wherein a, b, and c each represents a weight or atomic percentage. In one embodiment, a is in the range of from 45 to 65, b is in the range of from 7.5 to 35, and c is in the range of from 10 to 37.5 in atomic percentages. Alternatively, the alloy can have the formula $(Zr)_a(Nb, Ti)_b(Ni, Cu)_c(Al)_d$, wherein a, b, c, and d each represents a weight or atomic percentage. In one embodiment, a is in the range of from 45 to 65, b is in the range of from 0 to 10, c is in the range of from 20 to 40 and d is in the range of from 7.5 to 15 in atomic percentages. One exemplary embodiment of the aforedescribed alloy system is a Zr—Ti—Ni—Cu—Be based amorphous alloy under the trade name Vitreloy™, such as Vitreloy-1 and Vitreloy-101, as fabricated by Liquidmetal Technologies, CA, USA. Some examples of amorphous alloys of the different systems are provided in Table 1.

The amorphous alloys can also be ferrous alloys, such as (Fe, Ni, Co) based alloys. Examples of such compositions are disclosed in U.S. Pat. Nos. 6,325,868; 5,288,344; 5,368,659; 5,618,359; and 5,735,975, Inoue et al., Appl. Phys. Lett., Volume 71, p 464 (1997), Shen et al., Mater. Trans., JIM, Volume 42, p 2136 (2001), and Japanese Patent Application No. 200126277 (Pub. No. 2001303218 A). One exemplary composition is $Fe_{72}Al_5Ga_2P_{11}C_6B_4$. Another example is $Fe_{72}Al_7Zr_{10}Mo_5W_2B_{15}$. Another iron-based alloy system that can be used in the coating herein is disclosed in U.S. Patent Application Publication No. 2010/0084052, wherein the amorphous metal contains, for example, manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron.

The aforedescribed amorphous alloy systems can further include additional elements, such as additional transition metal elements, including Nb, Cr, V, and Co. The additional elements can be present at less than or equal to about 30 wt %, such as less than or equal to about 20 wt %, such as less than or equal to about 10 wt %, such as less than or equal to about 5 wt %. In one embodiment, the additional, optional element is at least one of cobalt, manganese, zirconium, tantalum, niobium, tungsten, yttrium, titanium, vanadium and hafnium to form carbides and further improve wear and corrosion resistance. Further optional elements may include phosphorous, germanium and arsenic, totaling up to about 2%, and preferably less than 1%, to reduce melting point. Otherwise incidental impurities should be less than about 2% and preferably 0.5%.

TABLE 1

Exemplary amorphous alloy compositions

| Alloy | Atm % | Atm % | Atm % | Atm % | Atm % | Atm % |
|---|---|---|---|---|---|---|
| 1 | Zr 41.20% | Ti 13.80% | Cu 12.50% | Ni 10.00% | Be 22.50% | |
| 2 | Zr 44.00% | Ti 11.00% | Cu 10.00% | Ni 10.00% | Be 25.00% | |
| 3 | Zr 56.25% | Ti 11.25% | Cu 6.88% | Ni 5.63% | Nb 7.50% | Be 12.50% |
| 4 | Zr 64.75% | Ti 5.60% | Cu 14.90% | Ni 11.15% | Al 2.60% | Be 1.00% |

TABLE 1-continued

Exemplary amorphous alloy compositions

| Alloy | Atm % | Atm % | Atm % | Atm % | Atm % | Atm % |
|---|---|---|---|---|---|---|
| 5 | Zr 52.50% | Ti 5.00% | Cu 17.90% | Ni 14.60% | Al 10.00% | |
| 6 | Zr 57.00% | Nb 5.00% | Cu 15.40% | Ni 12.60% | Al 10.00% | |
| 7 | Zr 50.75% | Cu 36.23% | Ni 4.03% | Al 9.00% | Sn 0.50% | |
| 8 | Zr 46.75% | Ti 8.25% | Cu 7.50% | Ni 10.00% | Be 27.50% | |
| 9 | Zr 21.67% | Ti 43.33% | Ni 7.50% | Be 27.50% | | |
| 10 | Zr 35.00% | Ti 30.00% | Cu 7.50% | Be 27.50% | | |
| 11 | Zr 35.00% | Ti 30.00% | Co 6.00% | Be 29.00% | | |
| 12 | Au 49.00% | Ag 5.50% | Pd 2.30% | Cu 26.90% | Si 16.30% | |
| 13 | Au 50.90% | Ag 3.00% | Pd 2.30% | Cu 27.80% | Si 16.00% | |
| 14 | Pt 57.50% | Cu 14.70% | Ni 5.30% | P 22.50% | | |
| 15 | Zr 36.60% | Ti 31.40% | Nb 7.00% | Cu 5.90% | Be 19.10% | |
| 16 | Zr 38.30% | Ti 32.90% | Nb 7.30% | Cu 6.20% | Be 15.30% | |
| 17 | Zr 39.60% | Ti 33.90% | Nb 7.60% | Cu 6.40% | Be 12.50% | |
| 18 | Cu 47.00% | Ti 34.00% | Zr 11.00% | Ni 8.00% | | |
| 19 | Zr 55.00% | Co 25.00% | Al 20.00% | | | |

In some embodiments, a composition having an amorphous alloy can include a small amount of impurities. The impurity elements can be intentionally added to modify the properties of the composition, such as improving the mechanical properties (e.g., hardness, strength, fracture mechanism, etc.) and/or improving the corrosion resistance. Alternatively, the impurities can be present as inevitable, incidental impurities, such as those obtained as a byproduct of processing and manufacturing. The impurities can be less than or equal to about 10 wt %, such as about 5 wt %, such as about 2 wt %, such as about 1 wt %, such as about 0.5 wt %, such as about 0.1 wt %. In some embodiments, these percentages can be volume percentages instead of weight percentages. In one embodiment, the alloy sample/composition consists essentially of the amorphous alloy (with only a small incidental amount of impurities). In another embodiment, the composition includes the amorphous alloy (with no observable trace of impurities).

In one embodiment, the final parts exceeded the critical casting thickness of the bulk solidifying amorphous alloys.

In embodiments herein, the existence of a supercooled liquid region in which the bulk-solidifying amorphous alloy can exist as a high viscous liquid allows for superplastic forming. Large plastic deformations can be obtained. The ability to undergo large plastic deformation in the supercooled liquid region is used for the forming and/or cutting process. As oppose to solids, the liquid bulk solidifying alloy deforms locally which drastically lowers the required energy for cutting and forming. The ease of cutting and forming depends on the temperature of the alloy, the mold, and the cutting tool. As higher is the temperature, the lower is the viscosity, and consequently easier is the cutting and forming.

Embodiments herein can utilize a thermoplastic-forming process with amorphous alloys carried out between Tg and Tx, for example. Herein, Tx and Tg are determined from standard DSC measurements at typical heating rates (e.g.

20° C./min) as the onset of crystallization temperature and the onset of glass transition temperature.

The amorphous alloy components can have the critical casting thickness and the final part can have thickness that is thicker than the critical casting thickness. Moreover, the time and temperature of the heating and shaping operation is selected such that the elastic strain limit of the amorphous alloy could be substantially preserved to be not less than 1.0%, and preferably not being less than 1.5%. In the context of the embodiments herein, temperatures around glass transition means the forming temperatures can be below glass transition, at or around glass transition, and above glass transition temperature, but preferably at temperatures below the crystallization temperature $T_x$. The cooling step is carried out at rates similar to the heating rates at the heating step, and preferably at rates greater than the heating rates at the heating step. The cooling step is also achieved preferably while the forming and shaping loads are still maintained.

Electronic Devices

The embodiments herein can be valuable in the fabrication of electronic devices using a BMG. An electronic device herein can refer to any electronic device known in the art. For example, it can be a telephone, such as a cell phone, and a land-line phone, or any communication device, such as a smart phone, including, for example an iPhone™, and an electronic email sending/receiving device. It can be a part of a display, such as a digital display, a TV monitor, an electronic-book reader, a portable web-browser (e.g., iPad™), and a computer monitor. It can also be an entertainment device, including a portable DVD player, conventional DVD player, Blue-Ray disk player, video game console, music player, such as a portable music player (e.g., iPod™), etc. It can also be a part of a device that provides control, such as controlling the streaming of images, videos, sounds (e.g., Apple TV™), or it can be a remote control for an electronic device. It can be a part of a computer or its accessories, such as the hard drive tower housing or casing, laptop housing, laptop keyboard, laptop track pad, desktop keyboard, mouse, and speaker. The article can also be applied to a device such as a watch or a clock.

Bulk Amorphous Alloy Heat Sink

In embodiments herein, a "heat sink" is an object that transfers thermal energy from a higher temperature to a lower temperature fluid medium. The fluid medium is frequently air, but can also be water or in the case of heat exchangers, refrigerants and oil. If the fluid medium is water, the heat sink could be called a cold plate.

The embodiments herein relate to amorphous alloy heat sinks. However, the majority of bulk amorphous alloy do not have a very high thermal conductivity, particularly the zirconium based amorphous alloys. Titanium and zirconium are not known for their high thermal conductivity so ordinarily one would not want to have a heat sink of this material. However, the bulk amorphous alloys offer a very unique means of patterning them on extremely fine dimensions such that the molded in or thermo formed features can go down to the tens of nanometers in size without etching. Thus, by creating a tremendous amount of surface area one could create fine features with extremely high surface area one would be able to improve substantially the ability to dissipate heat. After forming the high surface area amorphous alloy heat sink substrate, one would take the patterned surface and deposit a high thermal conductivity material on the surface (for example, see FIG. 3) using for example plasma vapor deposition or chemical vapor deposition (PVD or CVD) potentially other processes. Materials that might be good candidates include copper, diamond and pyrolytic graphite, pyrolytic boron nitride, silver, gold, among others.

Another heat sink material that can be used is diamond or diamond-like coating (also referred to as diamond-like carbon (DLC)). With a value of 2000 W/mK, the thermal conductivity of diamond exceeds that of copper by a factor of five. In contrast to metals, where heat is conducted by delocalized electrons, lattice vibrations are responsible for diamond's very high thermal conductivity. Nowadays synthetic diamond is used for high-power integrated circuits and laser diodes.

DLC exists in different forms of amorphous carbon materials that display some of the typical properties of diamond. They can be usually applied as coatings to other materials such as bulk solidifying amorphous alloys that could benefit from some of those properties. All forms contain significant amounts of sp3 hybridized carbon atoms. The reason that there are different types of DLC is that even diamond can be found in two crystalline polytypes. The usual one has its carbon atoms arranged in a cubic lattice, while the very rare one (lonsdaleite) has a hexagonal lattice. By mixing these polytypes in various ways at the nanoscale level of structure, DLC coatings can be made that at the same time are amorphous, flexible, and yet purely sp3 bonded "diamond." The hardest, strongest, and slickest is such a mixture, known as tetrahedral amorphous carbon, or ta-C. For example, a coating of only 2 μm thickness of ta-C increases the resistance of common (i.e. type 304) stainless steel against abrasive wear; changing its lifetime in such service from one week to 85 years. Such ta-C can be considered to be the "pure" form of DLC, since it consists only of sp3 bonded carbon atoms. Fillers such as hydrogen, graphitic sp2 carbon, and metals can be used in the other forms of DLC to reduce production expenses or to impart other desirable properties. The various forms of DLC can be applied to almost any material that is compatible with a vacuum environment.

Composite materials can be used for heat sink. Examples are a copper-tungsten pseudoalloy, AlSiC (silicon carbide in aluminum matrix), Dymalloy (diamond in copper-silver alloy matrix), and E-Material (beryllium oxide in beryllium matrix). Such materials are often used as substrates for chips, as their thermal expansion coefficient can be matched to ceramics and semiconductors.

The cooling fluid could be air, water or any other fluid coolant. One could also use the heat amorphous alloy heat sink with a liquid like water such that one could pattern the interior of the heat sink with a water channel to remove heat from within the heat sink. For example, one could design a water jacket and/or a heat exchanger within and/or outside the heat sink.

Figure 4:
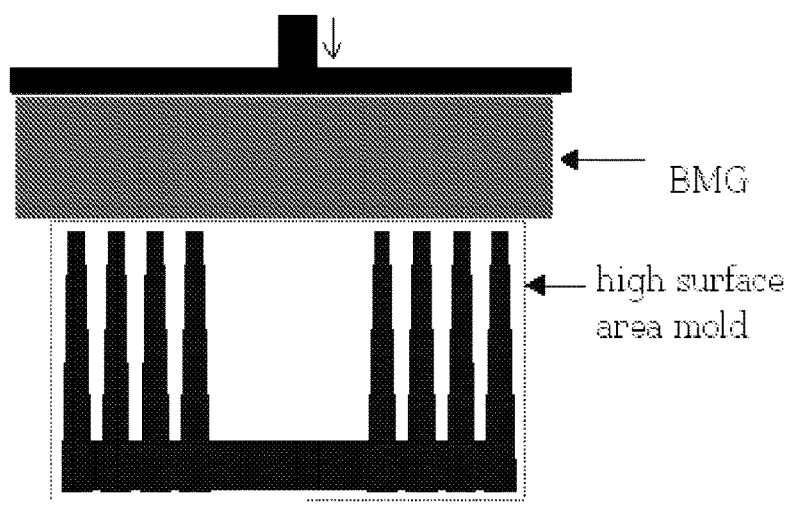
FIG. 4 provides a schematic of superplastic molding of a bulk solidifying amorphous alloy to form a heat sink.

One could pattern the surfaces of an amorphous alloy heat sink in several different ways. Currently, large heat sinks a patterned by machining while small heat sinks are patterned by etching or micro electronic discharge machining (EDM). These are all fairly expensive processes and require a lot of setup. However, with the embodiments herein, one could pattern the amorphous alloy heat sinks without machining, etching or EDM using thermo plastic forming an amorphous bulk metallic glass, and form very fine features in a relatively short and inexpensive set of steps. One could heat a mold, apply the amorphous alloy to the heated mold or alternatively one could heat the amorphous alloy into a super cool liquid region between Tg and Tm in FIG. 2 and press it into the mold to form extremely fine features very rapidly by deforming the material as shown in FIG. 4.

Figure 3:
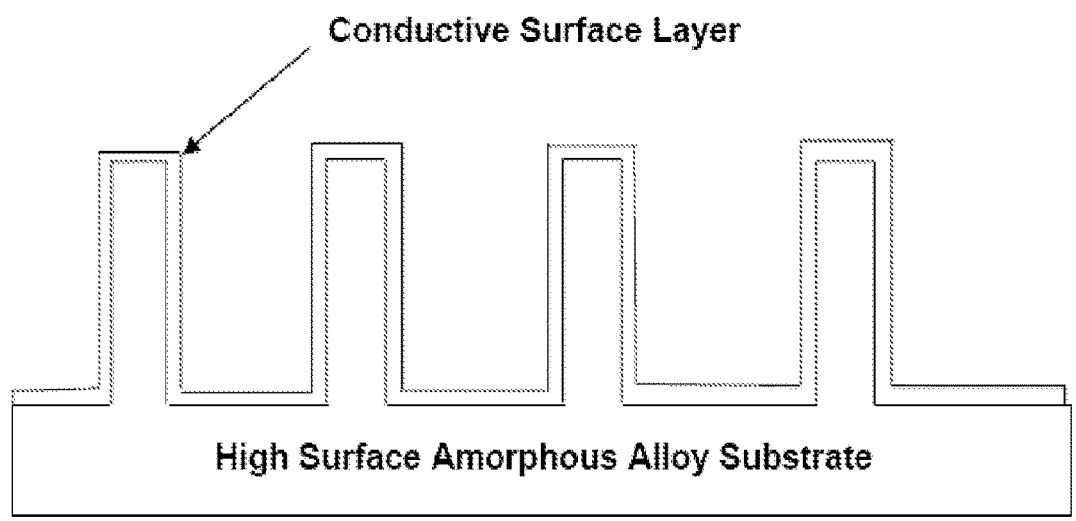
FIG. 3 provides a schematic of a heat sink of an embodiment wherein the heat sink has a coating of a high conductivity material.

In another embodiment the patterning in the bulk solidifying amorphous alloy heat sink could be created by casting into a mold while maintaining the time-temperature profile within the heat sink like the time-temperature profile (1) in FIG. 2 such that the time-temperature profile does not cross the crystalline region of the metal alloy forming the bulk solidifying amorphous alloy heat sink. In another embodiment the mold and or mesh could be sacrificial. This implies that once one forms the patterned bulk solidifying amorphous alloy heat sink onto the mold one would remove the mold material either by etching or burning it, e.g., in the case of carbon mold, for example. In another embodiment the mold is removed by heat or chemicals or at least part of the mold is not removed and remains an integral part of the heat sink such that one could form a textured surface on the bulk solidifying amorphous alloy heat sink while retaining a portion of the mold used for texturing. The surface topography of the bulk solidifying amorphous alloy could be coated with a thermally conductive material as shown in FIG. 3.

In one variation, one could make the micro features with high surface area on an amorphous alloy heat sink and subsequently crystallize the amorphous alloy heat sink either at selected locations or throughout by heating and slow cooling such that the time-temperature profile would traverse through the crystalline region of FIG. 2. One might prefer to make the heat sink or portion thereof to be crystalline, e.g., to increase the thermal conductivity of the heat sink as the crystalline form of a material usually has a higher thermal conductivity than the amorphous form. Also, during the coating process itself can go up as high as 300 to 400 degree C. in certain circumstances or at least the surface to be coated can get that hot. In that case, the amorphous alloy of the heat sink could automatically become crystalline. However, as the heat sink by the embodiments herein do not have to be amorphous once the patterning is complete, one could allow the heat sink to be crystalline to relax the process conditions for the coating process.

Figure 5:
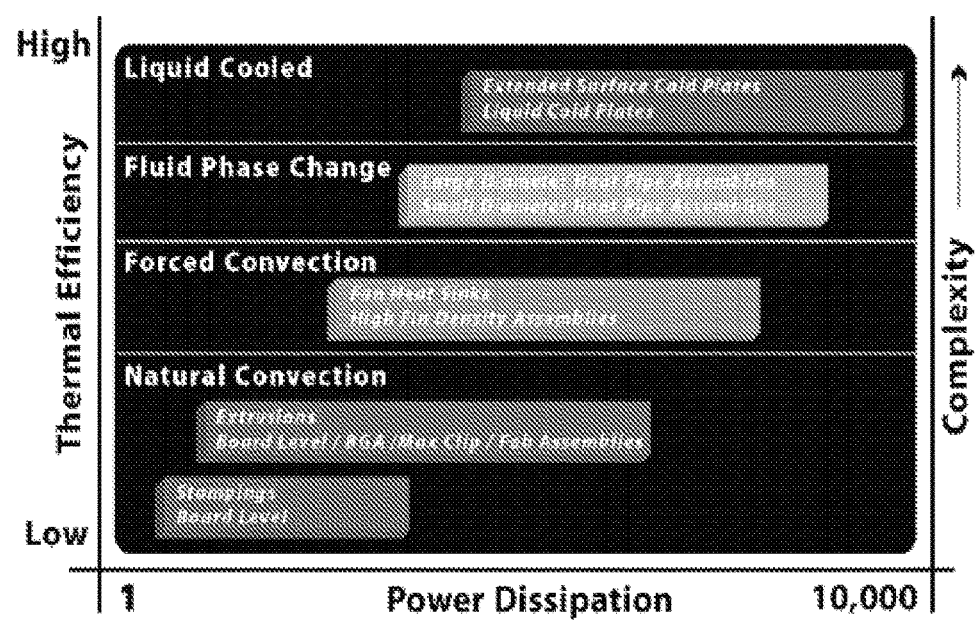
FIG. 5 provides a schematic that illustrates the relationship between the power dissipated in an application versus the thermal efficiency for different types of heat sinks.

FIG. 5 (obtained from http://www.aavidthermalloy.com/solutions/overview) is a schematic that illustrates the relationship between the power dissipated in an application versus the thermal efficiency for different types of heat sinks. The X Axis indicates the total amount of power to be removed, while the Y Axis can be defined as the relationship of thermal resistance with respect to total power, unit volume, and heat flux density. This tool serves as the starting point for solving thermal problems by narrowing the field of available solutions. Suitable technologies for an application can be identified by plotting the expected Power Dissipation on the X Axis and considering the entire range of intersecting solutions along the Y Axis. Dependent upon the power used and the dynamics of the system configuration, there may be more than one appropriate cooling mechanism to solve your thermal problem.

Heat sinks of the embodiments herein can be classified according to the primary cooling mechanisms: natural convection, forced convection, fluid phase change and liquid cooled.

Figure 6:
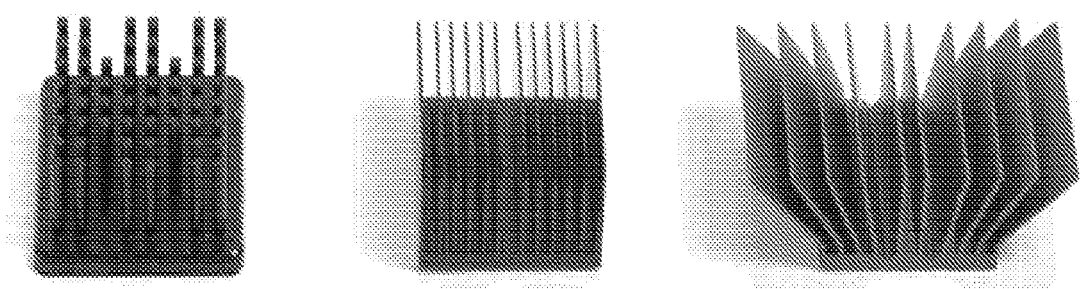
FIG. 6 shows pin-, straight- and flared fin heat sink types.

Natural convection heat sinks do not rely on a specified local air velocity for heat dissipation. The natural convection heat sinks are passive in nature. Natural convention heat sinks could be stamped heat sinks or extruded heat sinks that provide an economical solution to low power density thermal problems in natural convection environments. Complex heat dissipation structures can be created by stamping amorphous alloy with a stamper or forcing amorphous alloy through an extrusion die. FIG. 6 shows pin-, straight- and flared fin heat sink types. These complex profiles allow greater heat dissipation through increased surface area. A pin fin heat sink is a heat sink that has pins that extend from its base. The pins can be cylindrical, elliptical or square. A second type of heat sink fin arrangement is the straight fin. These run the entire length of the heat sink. A variation on the straight fin heat sink is a cross cut heat sink. A straight fin heat sink is cut at regular intervals. In general, the more surface area a heat sink has, the better it works. The concept of a pin fin heat sink is to try to pack as much surface area into a given volume as possible. Attachment features and interface materials can easily be added during the manufacturing process.

Forced convection heat sinks (e.g., high fin density heat sinks and fan heat sinks) require forced air velocity generated through the incorporation of either a dedicated or system level fan(s) in order to increase thermal efficiency. Fan heat sinks, high fin density assemblies, as well as board level coolers could be configured from an amorphous alloy for either impingement or cross flow environments. High fin density heat sinks provide increased efficiency for high power applications under forced convection by creating greater volumetric surface area and could be classified into two types: high aspect ratio extrusions and fabricated fin assemblies. The fabricated fin assemblies could be constructed from a base and have independent fins, which could allow greater aspect ratios than extruded fins. amorphous alloy heat sinks can be assembled using a variety of amorphous alloy fin types such as stamped, folded, or zipper which are attached to an amorphous alloy base by thermal bonding the amorphous alloy fins to the amorphous alloy base at a temperature greater than the Tg of the amorphous alloy that forms the amorphous alloy fins and the amorphous alloy base. Alternatively, one could also bond the amorphous alloy fins to base which might not be a amorphous alloy base by epoxy bonding, swaging, brazing, or soldering.

Figure 7:
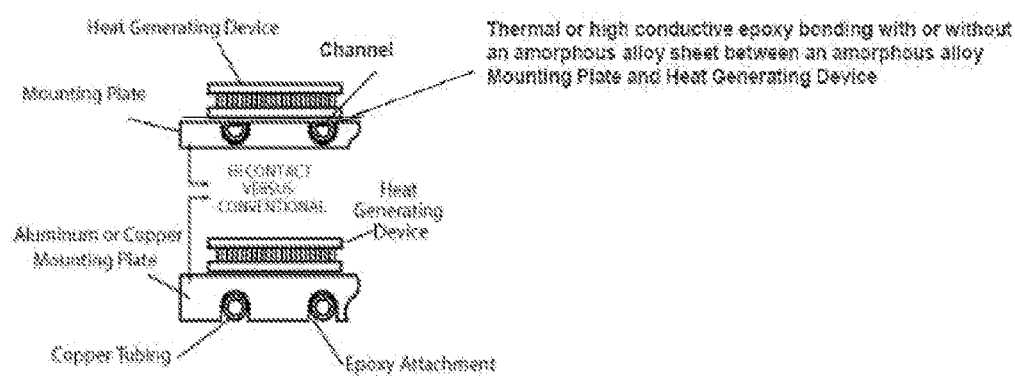
FIG. 7 provides a schematic of a heat generating device mounted on a heat sink having cooling channels substantially in contact with the heat generating device.

Fluid phase change heat sinks and liquid cooled heat sinks comprise closed loop heat pipes. Fluid phase change heat sinks allow the rapid exchange of heat transfer through evaporation and condensation. Liquid cooled heat sinks comprise channeled cold plates along with a heat exchanger and pump system in order to circulate fluids past a heat source. Generally, liquid cooled technologies are reserved for applications containing high heat flux density where forced convection or phase change systems are unable to dissipate the power demands. The liquid cooled heat sinks include liquid cold plates as well as extended surface and micro channel cold plates. Heat pipes could be integrated into other heat sink technologies to further increase the thermal efficiency when greater density is required or physical size restrictions exist. Heat pipes transport or spread heat to a point remote from the heat generator. The heat pipes could be small or large diameter heat pipes. The heat pipes could be spread out a horizontal or vertical manner. The heat pipes could be embedded in the base or the fins, though preferably would be in the base. Using amorphous alloy base plate having channels built in them for heat pipes such that heat pipes could be integrated into the base plate. The amorphous alloy base plate with channels therein would be coated with a high thermal conductivity material, if needed, and bonded (e.g., thermally by heating the amorphous alloy or by using high conductive bonding material such as high conductive epoxy) directly to the heat generating device or to a amorphous alloy sheet such that channels are enclosed by the amorphous alloy sheet. This system allows the construction of a base plate with channels (embedded heat pipes). The flat sheet can be in direct contact with the heat source, thus eliminating any solder joints between the heat source and embedded heat pipe as shown in the top figure of FIG. 7. The liquid cold plates such as the embodiment of the top figure of FIG. 7 would ensure minimum thermal resistance between the device and the cold plate by placing the coolant tube in direct contact with the device base plate. Direct contact reduces the number of thermal interfaces between device and fluid thus increasing performance unlike the use of a "dry joint" (see the bottom figure of FIG. 7) that generally leaves tiny air gaps between the base plate and tube.

Amorphous alloy liquid cold plates can be fabricated by stamping channels into a amorphous alloy cover plate rather than making channels inside a amorphous alloy base plate and covering them with a flat cover plate. Thermal bonding of the amorphous alloy cover plate and the amorphous alloy base plate would create a leak free joint between the base and cover plate. Unlike milled cold plates, the stamped channels would allow greater flexibility to drill mounting holes in the under side of the heat sink without regard for the location of the liquid channels. The inside of the channel could use offset fin structures to enhance thermal transfer performance.

Micro- and Nano-Channel Heat Sink

Another type of amorphous alloy heat sinks according the embodiments herein are the extended surface and micro- and/or nano-channel heat sinks, which would provide a superior performance of liquid cooling in a much smaller footprint by forcing fluid through a network of miniature passageways (micro capillaries) in an amorphous alloy heat sink cold plate mounted directly to a heat source. These compact, active solutions would be suitable for high performance microprocessors and other high heat flux density applications including insulated gate bipolar transistor (IGBT) modules. The major advantage of micro channel heat sinks is the high heat transfer coefficients would be up to 60 times higher than conventional heat exchangers.

Bulk amorphous alloys retain their fluidity from above the melting temperature down to the glass transition temperature due to the lack of a first order phase transition. This is in direct contrast to conventional metals and alloys. Since, bulk amorphous alloys retain their fluidity, they do not accumulate significant stress when cooled from their casting temperatures down to below the glass transition temperature, and as such dimensional distortions from thermal stress gradients can be minimized. Accordingly, intricate structures with large surface area and small thickness can be produced cost-effectively.

One exemplary method for producing nano- and micro-replications in structures using a molding process comprises the following steps.
1) Providing a sheet feedstock of amorphous alloy being substantially amorphous, and having an elastic strain limit of about 1.5% or greater and having a $\Delta T$ of 30° C. or greater;
2) Heating the feedstock to around the glass transition temperature;
3) Forming nano- and/or micro-replication in the heated feedstock;
4) Cooling the formed component to temperatures far below the glass transition temperature; and
5) Final finishing.

Preferably $\Delta T$ of the provided amorphous alloy is greater than 60° C., and most preferably greater than 90° C. Moreover, the time and temperature of the heating and shaping operation is selected such that the elastic strain limit of the amorphous alloy is substantially preserved to be not less than 1.0%, and preferably not being less than 1.5%. In the context of the embodiments herein, temperatures around glass transition means the forming temperatures can be below glass transition, at or around glass transition, and above glass transition temperature and below the melting temperature Tm, but preferably at temperatures below the crystallization temperature $T_X$. The cooling step is carried out at rates similar to the heating rates at the heating step, and preferably at rates greater than the heating rates at the heating step. The cooling step is also achieved preferably while the forming and shaping loads are still maintained.

In one embodiment, the nano- and/or micro-replication was carried out in a mold that is made out of nickel alloy. A micro-replication having the dimensions of a hologram was made on this mold, which was heated up to about 445° Celsius, within the supercooled liquid region of a bulk-solidifying amorphous alloy called LiquidMetal 1B. A hologram is basically a series of parallel channels on a surface, where the light comes in and the light reflects back.

For general purposes one could heat the mold up to within the super cool liquid region within Tg and Tm or Tg and Tx of the amorphous alloy. One can use the mold to create a replication on a bulk-solidifying amorphous alloy part by applying pressure on the bulk-solidifying amorphous alloy, and the pressure can range from a few pounds to a few hundred pounds to a few thousands pounds. One does need to apply a lot of force such as that for stamping a shell metal made of a crystalline material. The force would proportional to the surface area of the micro-replication. If you have a small micro-replication, you can use less force than a larger micro-replication. In one embodiment, one even need not heat up the bulk-solidifying amorphous alloy. Instead, one could just heat up the mold and the mold can hold enough thermal energy that would heat up localized surface of the bulk-solidifying amorphous alloy and create a nano- and/or micro-replication of the mold with the micro-replication or any other feature in the bulk-solidifying amorphous alloy.

The embodiments herein further relate to a nano-replication of bulk-solidifying amorphous alloys with a mold like a stamping device that not like a die casting mold but more like a regular rubber stamp. So basically, one could have a stamp with the micro feature on the stamp, heat the stamp, press the stamp on a bulk-solidifying amorphous alloy and replicate the micro feature by embossing it directly on the surface of the bulk-solidifying amorphous alloy.

One novel feature of the embodiments is that one can get rid of wet processing or laser processing as conventionally required for forming micro-replications on a metal surface. Right now in order for a manufacturer to create a micro-replication on a metal surface one needs to do it with either laser or etch the surface using the photo lithography process, which is a wet process. It is very difficult to laser a micro-replication on a metal surface because the surface needs to be smooth to reflect the light. Also, as the feature of the micro-replication has a depth, the laser has to etch up to the depth to create a micro-replication. However, it is very difficult for a laser to etch up to the depth of a micro-replication required for a heat sink having fluid channels therein.

According to the embodiments, once one has created the mold, one can repeatedly use the mold, similar to a rubber stamp. One can literally just stamp the micro-replication into the surface of bulk-solidifying amorphous alloy portion of a part that one wants to create the micro-replication in and that is it.

The micro-replication on the bulk-solidifying amorphous alloy would be the same as that on the mold. With a stamped micro-replication, one can just stamp the micro-replication on a metal surface of a heat sink.

If the bulk solidifying is a material that reacts with oxygen or nitrogen under the forming temperature, like for example zirconium alloy, or titanium, zirconium based alloy, then one may need to carry out the process under the inert atmosphere. But if the bulk-solidifying amorphous alloys comprise alloys having a platinum base, a gold base, or a precious metal base, one does not really need to carry out the nano- or micro-replication under inert atmosphere. For one of the experiments, micro-replications were formed on a zirconium based bulk-solidifying amorphous alloy in air, and as long as there was no oxide formation on the surface of the zirconium based bulk-solidifying amorphous alloy, there was no need to perform the process under vacuum or in the atmosphere because the process was so fast and the temperature was not that high to cause any degradation of the zirconium based bulk-solidifying alloy. Similarly, titanium based bulk-solidifying amorphous alloys probably too do not need to be processed in vacuum or an inert environment.

The substrate of the heat sink on which these features are embossed would be made of a bulk-solidifying amorphous alloy with a desired geometry. The features can be impressed or embossed onto the surface of the bulk-solidifying amorphous alloy, previously formed (through casting or other means) by utilizing thermoplastic forming. The equipment required for thermoplastic forming could be a hydraulic press with control of displacement and pressure of the platens applying the load and a proper fixture to hold the part.

As shown in FIG. 5, one type of heat sink is the fluid-phase change transfer type. The two-phase flow and boiling heat transfer within the micro-channels result in high efficiency of thermal dissipation. Particularly, the micro-channels can be formed on an amorphous alloy substrate directly through a stamping process. Therefore, the use of high heat transfer cooling fluid within the micro-channels and the large heat transfer areas of the microchannels can easily remove a large amount of heat, thereby enhancing the performance of the electrical components. An electrical component and the micro-channel heat sink could be connected to each other by a thermal-conductive adhesive, and the heat generated from the electrical component will be promptly transferred to the microchannel heat sink through the thermal-conductive adhesive. The micro-channel heat sink could comprise an upper cover layer and a cooling substrate layer, wherein the cooling substrate layer could comprise a plurality of parallel micro-channels. Both the upper cover layer and the cooling substrate layer could be made of amorphous alloy and thermally bonded by heating them at a superplastic temperature between Tg and Tm as shown in FIG. 2. A working fluid fills micro-channels and flows from an inlet pipe to an outlet pipe. Meanwhile, the heat generated by the electrical component will be taken away from the cooling substrate layer.

In one embodiment, the plurality of micro-channels could be arranged in parallel and the cross-sectional areas of the micro-channels could be substantially the same along their longitudinal direction. However, it is possible that boiling in the micro-channel could occur and cause instability in the two phase flow. Such instability issue could occur particularly under conditions of high heat transfer rate and low flow rate. Instability of the heat flow could result the early reaching of the critical value of the heat transfer rate, resulting in absence of fluid in the channels and high temperatures on their inner wall surfaces. To minimize the potential problem of instability of heat flow, in one embodiment the cross sectional area of each of the micro-channels would increase along the direction from the inlet fluid tank towards the outlet fluid tank as discussed in US 2008/0308258 A1.

Another embodiment relates to integrating an electronic device such as an integrated circuit (IC) and amorphous alloy heat sink having micro cooling channels therein. In this embodiment, one could take a silicon wafer substrate or any other substrate of an electronic device such as an IC chip and coat a surface that would come in contact with the heat sink with a coating or layer of an amorphous alloy. Then, one could thermally bond the electronic device such as an IC chip to the amorphous alloy heat sink with micro channels in them with or without an amorphous alloy cover sheet between the amorphous alloy-coated surface of the electronic device and the amorphous alloy heat sink by superplastic forming at a temperature between Tg and Tm of the amorphous alloy. By this approach, one could form an electronic device that is integrated with the heat sink without using a thermal-conductive adhesive to bond the electronic device and the heat sink as is conventionally done.

In yet another embodiment, one could include a heat dissipating fin set and a cooling fan or thermoelectric cooling device along with the heat sink. The thermoelectric cooling device could be any device produces thermoelectric cooling using the Peltier effect to create a heat flux between the junction of two different types of materials.

A Peltier cooler is a solid-state active heat pump which transfers heat from one side of the device to the other side against the temperature gradient (from cold to hot), with consumption of electrical energy. In a Peltier cooler, electric power is used to generate a temperature difference between the two sides of the device. Such an instrument is also called a Peltier device, Peltier heat pump, solid state refrigerator, or thermoelectric cooler (TEC). The Peltier device is a heat pump: when direct current runs through it, heat is moved from one side to the other. Therefore it can be used either for heating or for cooling (refrigeration), although in the embodiments herein, the main application is cooling.

The heat dissipating fin set could be disposed on top of the heat sink. The heat dissipating fin set could be stamped into the surface of the amorphous alloy heat sink by superplastic forming as explained above. The cooling fan or thermoelectric cooling device could be mounted on top of the heat dissipating fin set. The cooling fan or thermoelectric cooling device could have a coating or layer of an amorphous alloy on the surface of the cooling fan or thermoelectric cooling device that would be in contact with the heat dissipating fin set and then thermally bond the cooling fan or thermoelectric cooling device to the fin set by superplastic forming. Since the cooling fan or thermoelectric cooling device provides a forced convection effect, the heat sink along with the cooling fan or thermoelectric cooling device could perform relatively excellent heat dissipation effect.

Figure 8:
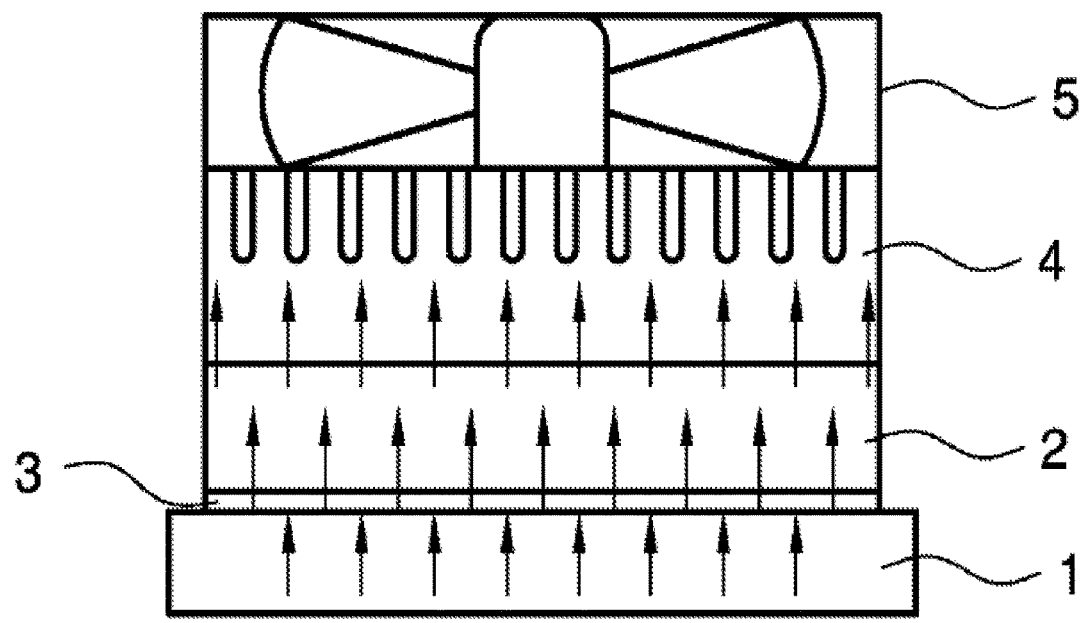
FIG. 8 provides a schematic of an apparatus having a heat dissipating fin set (4) and a cooling fan or thermoelectric cooling device (5) mounted on one side of a bulk solidifying amorphous alloy heat sink (3) and having an electronic device (1) mounted on the other side of the heat sink (2) with or without a cover layer (3) between the heat sink and the electronic device.

In yet another embodiment, the heat dissipating fin set (4) and the cooling fan or thermoelectric cooling device (5) could be mounted on one side of the amorphous alloy heat sink (3) while the electronic device (1) could be mounted on the other side of the heat sink (2) with or without a cover layer (3) between the heat sink and the electronic device as shown in FIG. 8. The heat sink could have micro-channels to run a fluid such as water through it, and the combination of the cooling fan or thermoelectric cooling device with an amorphous coating or layer, the amorphous alloy heat dissipating fin set, the amorphous alloy heat sink, the amorphous alloy cover layer (if used), and the electronic device having an amorphous coating or layer could all be thermally bonded together by superplastic forming to form a unitary device shown in FIG. 8 having both the electronic device and the heat sink. Such a heat sink would be cooled by both conduction running a liquid through the micro-channels and by convention by the cooling fan or thermoelectric cooling device mounted on the fin set.

What is claimed:

1. A method of forming a heat sink, comprising:
   heating at least a first portion of a bulk solidifying amorphous alloy component comprising an amorphous phase of a bulk solidifying amorphous alloy to a first temperature greater than a glass transition temperature (Tg) of the bulk solidifying amorphous alloy and below a melting temperature (Tm) of the bulk solidifying amorphous alloy;
   while the first portion of the bulk solidifying amorphous alloy component is at the first temperature, embossing, with a mold or a stamp, nano- and/or micro-scale features on a surface of the bulk solidifying amorphous alloy component;
   cooling the first portion of the bulk solidifying amorphous alloy component to a second temperature below Tg; and
   after embossing the nano- and/or micro-scale features, crystallizing at least a second portion of the bulk solidifying amorphous alloy component along the surface, thereby converting an amount of the amorphous phase in the second portion to a crystalline phase.

2. The method of claim 1, wherein the embossing comprises embossing the nano- and/or micro-scale features with the stamp.

3. The method of claim 2, wherein the stamp has a negative image of the nano- and/or micro-scale features.

4. The method of claim 1, wherein the mold has a negative image of the nano- and/or micro-scale features.

5. The method of claim 1, wherein during the embossing, a temperature of the bulk solidifying amorphous alloy is below Tg or above Tg, except that a localized temperature in an area to be embossed is at the first temperature.

6. The method of claim 1, wherein:
   the method further comprises inserting the bulk solidifying amorphous alloy into the mold; and
   the operation of embossing the nano- and/or micro-scale features comprises applying force on the bulk solidifying amorphous alloy via the mold.

7. The method of claim 1, wherein the bulk solidifying amorphous alloy is described by the following molecular formula: $(Zr, Ti)_a(Ni, Cu, Fe)_b(Be, Al, Si, B)_c$, wherein "a" is in the range of from 30 to 75, "b" is in the range of from 5 to 60, and "c" is in the range of from 0 to 50 in atomic percentages.

8. The method of claim 1, wherein the bulk solidifying amorphous alloy is described by the following molecular formula: $(Zr, Ti)_a(Ni, Cu)_b(Be)_c$, wherein "a" is in the range of from 40 to 75, "b" is in the range of from 5 to 50, and "c" is in the range of from 5 to 50 in atomic percentages.

9. The method of claim 1, wherein the bulk solidifying amorphous alloy can sustain strains up to 1.5% or more without any permanent deformation or breakage.

10. The method of claim 1, wherein the nano- and/or micro-scale features define a channel for transporting a fluid therethrough.

11. The method of claim 10, wherein the fluid comprises a liquid.

12. The method of claim 1, wherein the method is carried out without wet processing or etching.

13. The method of claim 1, further comprising coating a conductive layer on a surface of the heat sink.

14. The method of claim 1, further comprising thermally bonding the heat sink to an object by superplastic forming of the heat sink.

15. The method of claim 14, wherein the object is an electronic device, a cooling fan and/or a thermoelectric cooling device.

16. The method of claim 14, further comprising thermally bonding a bulk solidifying amorphous alloy cover layer between the heat sink and the object.

17. The method of claim 1, wherein a surface of the bulk solidifying amorphous alloy component is heated to produce the crystalline phase.

18. The method of claim 1, wherein the heat sink is configured to transfer heat out of the heat sink by natural convection by air, forced convection by air, fluid phase change of a fluid and/or liquid cooling by a liquid.

19. The method of claim 1, wherein the operation of converting at least the second portion of the bulk solidifying amorphous alloy from the amorphous phase to the crystalline phase comprises:
   heating at least the second portion of the bulk solidifying amorphous alloy component; and
   cooling the second portion of the bulk solidifying amorphous alloy component at a rate selected to crystallize at least the second portion of the bulk solidifying amorphous alloy component.

20. A heat sink comprising:
   a metal alloy structure of unitary construction comprising:
      a first portion comprising a bulk solidifying amorphous alloy having an amorphous phase;
      a second portion having a crystalline phase; and
      nano- and/or micro-scale features embossed on a surface of the metal alloy structure; wherein
      the heat sink is configured to transfer heat by natural convection by air or forced convection by air; and
      the crystalline phase is formed along the surface of the metal alloy structure.

21. An apparatus comprising the heat sink of claim 20 and an electronic device thermally coupled to the heat sink.

22. The apparatus of claim 21, wherein the electronic device is an IC chip.

23. The heat sink of claim 20, wherein the second portion comprises at least 90% by volume of the crystalline phase.

24. A heat sink comprising:
   a component formed of a unitary metal structure and comprising:
      at least one of nano- or micro-scale features formed at a crystalline surface of the component and configured to dissipate heat; and
      a base portion comprising an amorphous phase of a bulk solidifying amorphous alloy and having a thermal conductivity lower than a thermal conductivity of the crystalline surface and a same chemical composition as the crystalline surface.

25. An apparatus comprising the heat sink of claim 24 and an electronic device thermally coupled to the heat sink.

26. The apparatus of claim 25, wherein the electronic device is an IC chip.

27. The apparatus of claim 25, further comprising a cooling device thermally coupled to the heat sink.

28. The apparatus of claim 27, wherein the cooling device is a cooling fan and/or a thermoelectric cooling device.

* * * * *